(12) United States Patent
Domino et al.

(10) Patent No.: US 12,191,826 B2
(45) Date of Patent: Jan. 7, 2025

(54) METHOD FOR ADJUSTING POWER AMPLIFIER IMPEDANCE

(71) Applicant: Skyworks Solutions, Inc., Irvine, CA (US)

(72) Inventors: William J. Domino, Yorba Linda, CA (US); Craig Joseph Christmas, Irvine, CA (US); Joseph Anton Pusl, III, Encinitas, CA (US); René Rodríguez, Rancho Santa Margarita, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 604 days.

(21) Appl. No.: 17/448,663

(22) Filed: Sep. 23, 2021

(65) Prior Publication Data

US 2022/0103136 A1    Mar. 31, 2022

Related U.S. Application Data

(60) Provisional application No. 63/085,040, filed on Sep. 29, 2020, provisional application No. 63/085,006, filed on Sep. 29, 2020.

(51) Int. Cl.
*H03F 3/14* (2006.01)
*H03F 1/56* (2006.01)
*H03F 3/195* (2006.01)
*H03F 3/24* (2006.01)
*H04B 1/04* (2006.01)

(52) U.S. Cl.
CPC ............. *H03F 3/245* (2013.01); *H03F 1/56* (2013.01); *H03F 1/565* (2013.01); *H03F 3/195* (2013.01); *H04B 1/0458* (2013.01); *H03F 2200/387* (2013.01); *H03F 2200/451* (2013.01)

(58) Field of Classification Search
CPC . H03F 3/245; H03F 1/56; H03F 1/565; H03F 3/195; H03F 2200/387; H03F 2200/451; H03F 2200/414; H04B 1/0458; H03H 2007/386; H03H 7/38
See application file for complete search history.

(56) References Cited

U.S. PATENT DOCUMENTS 7,050,769 B2 * 5/2006 Imai ................. H04B 1/406 455/127.1
9,054,756 B2 * 6/2015 See ..................... H04B 1/18
(Continued)

*Primary Examiner* — Khanh V Nguyen
(74) *Attorney, Agent, or Firm* — Knobbe, Martens, Olson & Bear, LLP

(57) ABSTRACT

A method of adjusting an impedance of a power amplifier of a radio frequency system for matching with an antenna switch die is disclosed. In one aspect, the method includes connecting the power amplifier to the antenna switch die via an impedance adjustment circuit, the impedance adjustment circuit including an input node, an output node, a plurality of electrical components arranged between the input node and the output node, and at least one switch configured to selectively electrically connect at least one of the electrical components to the input node and the output node. The method further includes determining an Error Vector Magnitude of the radio frequency system for each of a plurality of states of the at least one switch, and controlling the at least one switch to enter the state of the plurality of states that minimizes the Error Vector Magnitude of the radio frequency system.

20 Claims, 17 Drawing Sheets

(56) References Cited

U.S. PATENT DOCUMENTS

| | | |
|---|---|---|
| 9,813,137 B2 | 11/2017 | Wloczysiak et al. |
| 9,876,478 B2 | 1/2018 | Modi et al. |
| 9,893,752 B2 | 2/2018 | Domino et al. |
| 10,218,390 B2 | 2/2019 | Wloczysiak et al. |
| 10,396,737 B2 | 8/2019 | Domino et al. |
| 10,404,302 B2 | 9/2019 | Pullela et al. |
| 10,439,288 B2 | 10/2019 | Rodriguez |
| 10,554,197 B2 | 2/2020 | Domino et al. |
| 10,615,841 B2 | 4/2020 | Liu et al. |
| 10,972,055 B2 | 4/2021 | Naraine et al. |
| 11,159,195 B2 | 10/2021 | Pusl, III et al. |
| 11,323,158 B2 | 5/2022 | Brunel et al. |
| 11,575,351 B2 | 2/2023 | Ranta et al. |
| 2005/0176380 A1* | 8/2005 | Okabe ............... H04B 1/38 455/73 |
| 2017/0033772 A1 | 2/2017 | Domino |
| 2019/0245577 A1 | 8/2019 | Sun et al. |
| 2019/0253087 A1 | 8/2019 | Domino |
| 2021/0167733 A1 | 6/2021 | Drogi et al. |
| 2021/0211107 A1 | 7/2021 | Liu et al. |
| 2022/0103139 A1 | 3/2022 | Domino et al. |
| 2023/0017268 A1 | 1/2023 | Domino |

* cited by examiner

IMPEDANCE Z = R + jX

——— CONSTANT RESISTANCE (R) CIRCLE
——— CONSTANT REACTANCE (X) ARC
·········· CONSTANT CONDUCTANCE (G) CIRCLE
—·—·— CONSTANT VSWR CIRCLE

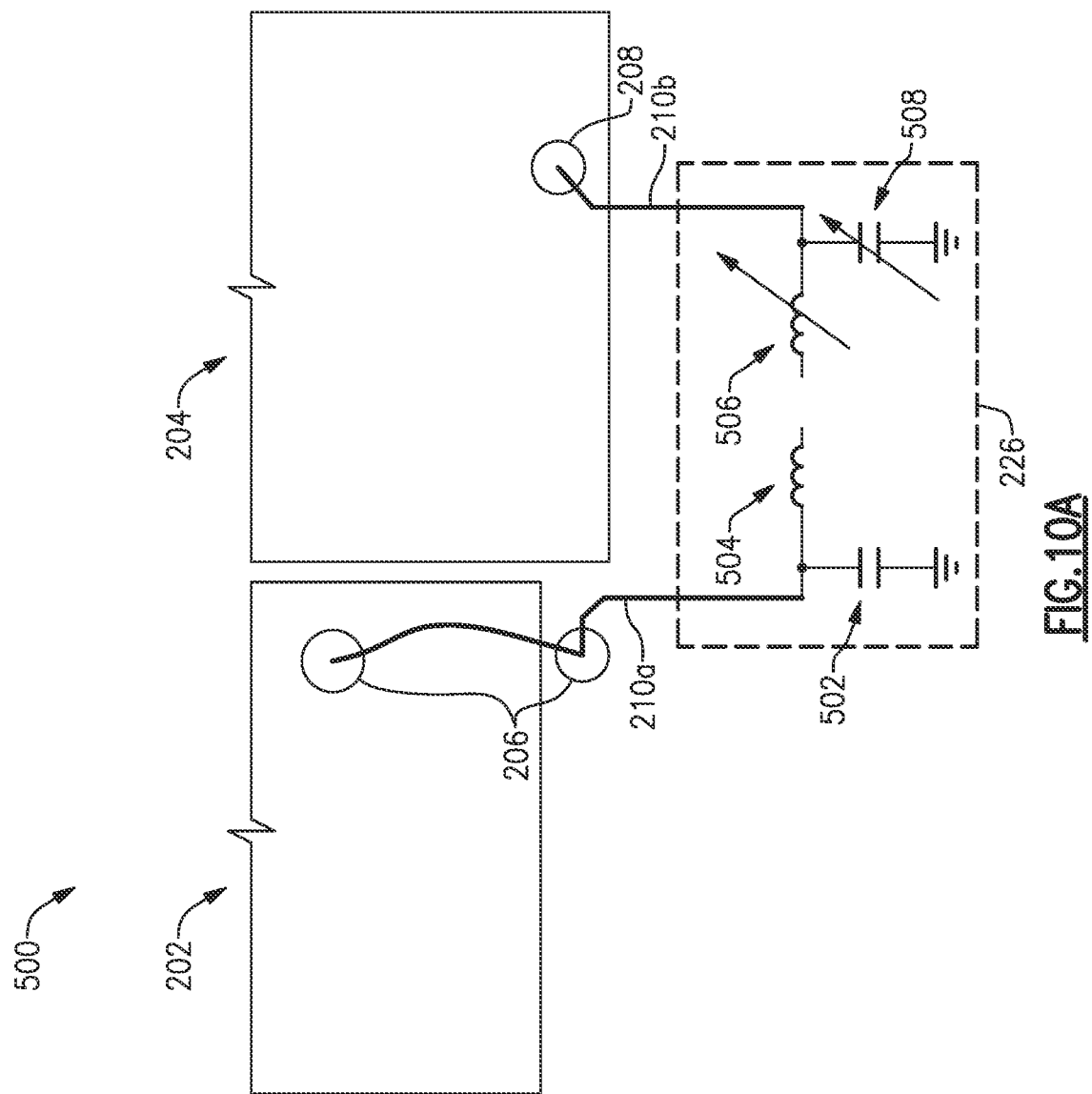

METHOD FOR ADJUSTING POWER AMPLIFIER IMPEDANCE

CROSS-REFERENCE TO RELATED APPLICATION(S)

Any and all applications for which a foreign or domestic priority claim is identified in the Application Data Sheet as filed with the present application are hereby incorporated by reference under 37 CFR 1.57.

BACKGROUND

Field

Embodiments of the disclosure relate to impedance adjustment circuits and related devices and methods.

Description of the Related Technology

In radio frequency (RF) applications, power transfer is improved for a signal when impedance is matched between two components encountered by the signal. For example, when a signal is generated by a radio circuit and sent to an antenna for transmission, it is desirable to have as much of the signal's power be delivered to the antenna.

Electronic devices are typically made from a plurality of electric and/or electronic components. Often, these device components will transfer signals with a particular amount of power between each other. Typically, the device components will each be associated with a particular impedance. This impedance can impact a signal or a power level of a signal.

To maximize power transfer, it is usually desirable for device components that are in direct electrical communication to have the same impedance at the interface between the components. In other words, it is usually desirable for a first component receiving a signal to have the same impedance at the input as a second component providing the signal to the first component has at its output. Thus, device components that are directly electrically connected are often designed to have the same impedance value between the device components.

However, in some cases, it is not possible to design two device components with the same impedance. In some such cases, an impedance matching component or circuit may be designed to match the impedance between two electrically connected device components. This impedance matching component may be inserted between the two electrically connected device components to match the impedance of the two device components. The impedance matching component can be effective in cases where the impedance of the two device components is static. However, in some cases, an impedance of a device component may not be static, but may be dynamic. In such cases, the impedance matching component may not be effective in some cases. Impedance matching on this type can be used in various applications, including the power amplifier used to amplifier an RF signal.

SUMMARY

The systems, methods and devices of this disclosure each have several innovative aspects, no single one of which is solely responsible for the desirable attributes disclosed herein.

In one aspect, there is provided a method of adjusting an impedance of a power amplifier of a radio frequency system for matching with an antenna switch die, the method comprising: connecting the power amplifier to the antenna switch die via an impedance adjustment circuit, the impedance adjustment circuit including an input node configured to receive the radio frequency signal from the power amplifier, an output node configured to provide the radio frequency signal to an antenna switch die, a plurality of electrical components arranged between the input node and the output node, and at least one switch configured to selectively electrically connect at least one of the electrical components to the input node and the output node; determining an Error Vector Magnitude of the radio frequency system for each of a plurality of states of the at least one switch; and controlling the at least one switch to enter the state of the plurality of states that minimizes the Error Vector Magnitude of the radio frequency system.

The plurality of states of the at least one switch can include four states that respectively define four tuned impedance points when viewed on a Smith chart, and the at least four tuned impedance points can surround a target tuned impedance point of the radio frequency system.

The plurality of electrical components can include at least one series element and at least one shunt element.

The at least one series element can include a first inductor and a second inductor and the at least one shunt element includes a first capacitor and a second capacitor.

The impedance adjustment circuit can further include a trace that includes a first branch and a second branch, the trace is formed on multi-chip-module, and the first branch is formed to provide the first inductor and the second branch is formed to provide the second inductor.

The first capacitor and the second capacitor can be formed as metal insulator metal capacitors on the antenna switch die.

The first inductor can be electrically connected between the input and output nodes and the at least one switch can include a first switch configured to selectively connect the second inductor between the input and output nodes.

The second capacitor can be electrically connected between the output node and ground and the at least one switch can include a second switch configured to selectively connect the first capacitor between the output node and ground.

The plurality of states can include at least four tuned impedance points when viewed on a Smith chart, and the at least four tuned impedance points can surround a target tuned impedance point of the power amplifier.

The impedance adjustment circuit can be included as part of an radio frequency system including the power amplifier and the antenna switch die.

In another aspect, there is provided a method comprising: connecting a power amplifier to an antenna switch die via an impedance adjustment circuit, the impedance adjustment circuit including an input node configured to receive a radio frequency signal from the power amplifier, an output node configured to provide the radio frequency signal to an antenna switch die, a plurality of electrical components arranged between the input node and the output node, and at least one switch configured to selectively electrically connect at least one of the electrical components to the input node and the output node; and adjusting an impedance of the power amplifier by selecting one of a plurality of states of the at least one switch, each state of the plurality of states corresponding to an adjustment of an impedance of the power amplifier from a natural tune point in a direction towards a target tuned impedance point when viewed on a Smith chart.

The plurality of states of the at least one switch can include four states that respectively define four tuned impedance points when viewed on the Smith chart, and the at least four tuned impedance points can surround a target tuned impedance point of the radio frequency system.

The plurality of electrical components can include at least one series element and at least one shunt element.

The at least one series element can include a first inductor and a second inductor and the at least one shunt element can include a first capacitor and a second capacitor.

The impedance adjustment circuit can further include a trace that includes a first branch and a second branch, the trace is formed on multi-chip-module, and the first branch can be formed to provide the first inductor and the second branch is formed to provide the second inductor.

The first capacitor and the second capacitor can be formed as metal insulator metal capacitors on the antenna switch die.

The first inductor can be electrically connected between the input and output nodes and the at least one switch can include a first switch configured to selectively connect the second inductor between the input and output nodes.

The second capacitor can be electrically connected between the output node and ground and the at least one switch can include a second switch configured to selectively connect the first capacitor between the output node and ground.

The plurality of states can include at least four tuned impedance points when viewed on the Smith chart, and the at least four tuned impedance points surround a target tuned impedance point of the power amplifier.

The impedance adjustment circuit can be included as part of an radio frequency system including the power amplifier and the antenna switch die.

BRIEF DESCRIPTION OF THE DRAWINGS

FIG. 10A is a schematic diagram of one embodiment of an RF system in accordance with aspects of this disclosure.

DETAILED DESCRIPTION OF EMBODIMENTS

Figure 1A:
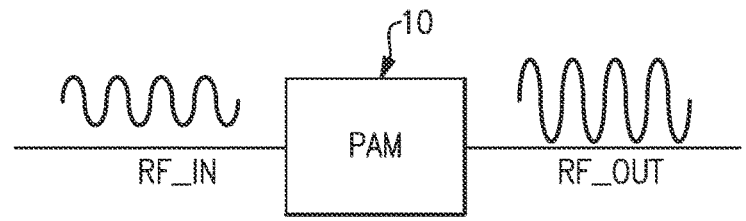
FIG. 1A is a schematic block diagram of a power amplifier module for amplifying a radio frequency (RF) signal.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The headings provided herein, if any, are for convenience only and do not necessarily affect the scope or meaning of the claimed invention.

Overview of Examples of Power Amplifier Systems

FIG. 1A is a schematic block diagram of a power amplifier module for amplifying a radio frequency (RF) signal. The illustrated power amplifier module (PAM) 10 can be configured to amplify an RF signal RF_IN to generate an amplified RF signal RF_OUT. As described herein, the power amplifier module can include one or more power amplifiers.

Figure 1B:
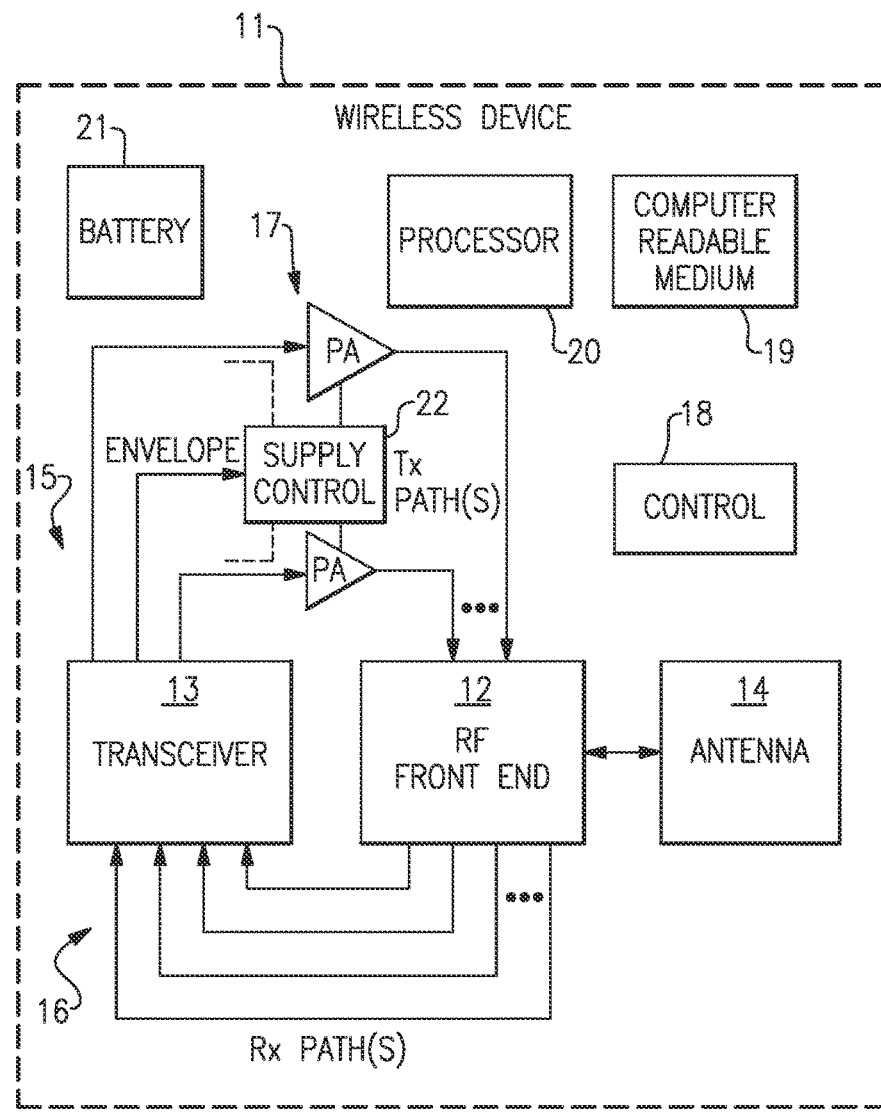
FIG. 1B is a schematic block diagram of an example wireless device that can include one or more of the power amplifier modules of FIG. 1A.

FIG. 1B is a schematic block diagram of an example wireless or mobile device 11 that can include one or more of the power amplifier modules 10 of FIG. 1A. The wireless device 11 can include power amplifiers implementing one or more features of the present disclosure.

The example wireless device 11 depicted in FIG. 1B can be a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 or more radio frequency spectrum bands.

One or more features of the present disclosure can be implemented in the foregoing example modes and/or bands, and in other communication standards. For example, 3G, 4G, LTE, advanced LTE, 5G, and 5G NR are non-limiting examples of such standards. In certain implementations, one or more features of the present disclosure can be implemented in a wireless local area network (WLAN), such as WiFi.

The illustrated wireless device 11 includes an RF front end 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 1B as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 1B as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 1B, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power and high power), and/or amplifications associated with different bands. Although the configuration illustrated in FIG. 1B includes two transmission paths 15, the wireless device 11 can be adapted to include more or fewer transmission paths 15.

In FIG. 1B, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although the configuration illustrated in FIG. 1B includes four receiving paths 16, the wireless device 11 can be adapted to include more or fewer receiving paths 16.

To facilitate switching between receive and transmit paths, the RF front end 12 can be configured to electrically connect the antenna 14 to a selected transmit or receive path. Thus, the RF front end 12 can provide a number of switching functionalities associated with an operation of the wireless device 11. In certain embodiments, the RF front end 12 can include a number of switches configured to provide functionalities associated with, for example, switching between different bands, switching between different power modes, switching between transmission and receiving modes, or some combination thereof. The RF front end 12 can also be configured to provide additional functionality, including filtering of signals. For example, the RF front end 12 can include one or more duplexers.

FIG. 1B shows that in certain embodiments, a control component 18 can be provided, and such a component can be configured to provide various control functionalities associated with operations of the RF front end 12, the power amplifiers 17, the supply control block 22, and/or other operating component(s). Non-limiting examples of the control component 18 are described herein in greater detail.

In certain embodiments, a processor 20 can be configured to facilitate implementation of various control processes. In certain configurations, the processor 20 operates using computer program instructions, which can be stored in a computer-readable memory 19.

The illustrated wireless device 11 also includes the supply control block 22, which can be used to provide a power amplifier supply voltage to one or more of the power amplifiers 17. For example, the supply control block 22 can be an envelope tracker configured to control the voltage level of the power amplifier supply voltage based upon an envelope of an RF signal to be amplified by one or more of the power amplifiers. However, in certain embodiments the supply control block 22 can be other blocks, including, for example, a DC-to-DC converter.

Overview of Examples of Impedance Tuners

In wireless devices such as mobile units, an impedance presented by an antenna to a radio circuit can vary with, for example, environmental changes. To maintain the best or acceptable impedance match between the radio circuit and the antenna, an impedance tuner can be implemented. Such an impedance tuner, typically inserted between the radio circuit and the antenna, can include a tunable inductor-capacitor (LC) network and be adjusted as needed when a mismatch in impedance is detected.

In many applications, such impedance circuits can be costly and/or be limited in tuning range capability. For example, in some embodiments, a tuner can include a single switchable element, either in series or in shunt relative to a signal path, resulting in two impedance tuning states.

In another example, a complex PI-network can be implemented using multiple inductors and multiple tunable capacitors (e.g., each tunable capacitor can include four binary-weighted capacitors switched to provide 16 possible capacitance values). Such a tuner can cover most of impedance regions in a Smith chart. However, such a tuner is typically overly complex and/or costly.

Figure 2A:
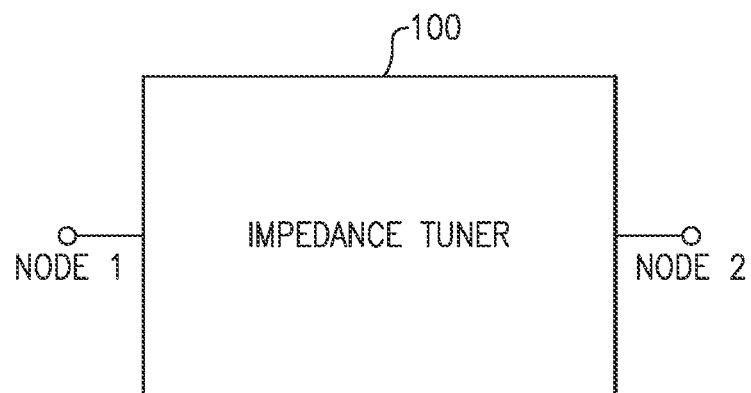
FIG. 2A is a schematic diagram of one embodiment of an impedance tuner in accordance with aspects of this disclosure.

FIG. 2A depicts an impedance tuner 100 having one or more features as described herein. Such an impedance tuner can be implemented between a first node (Node 1) and a second node (Node 2), and be configured to provide tunable matching of impedance between the first and second nodes. For example, suppose that an impedance presented at the second node (e.g., by a load connected to the second node) is different from a desired impedance for which a signal is provided to the first node (e.g., from a circuit). If the impedance tuner 100 is absent, the first and second nodes are essentially the same, and the signal will be presented with the mismatched impedance of the load at the first node. With the impedance tuner 100 implemented between the first and second nodes, the impedance tuner 100 can change the mismatched impedance of the load, so that an impedance presented to the signal at the first node is at the desired impedance, approximately at the desired impedance, or closer to the desired impedance.

For the purpose of description, an impedance tuner such as the impedance tuner 100 of FIG. 2A may also be referred to herein as, for example, an impedance tuner circuit, an impedance tuning circuit, a tuner circuit, a tuning circuit, a tuner, etc.

Figure 2B:
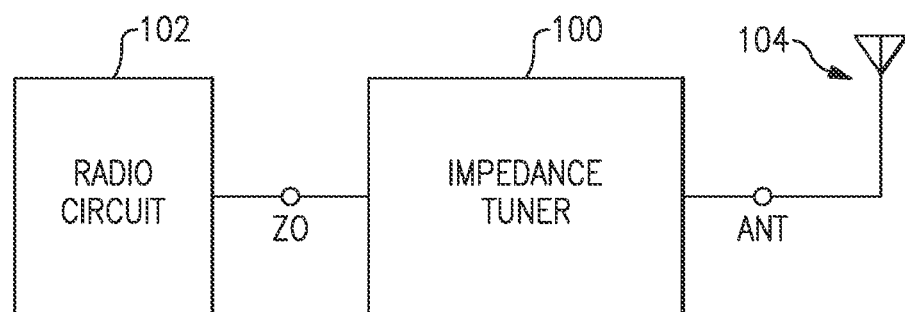
FIG. 2B is a schematic diagram illustrating that in some embodiments, the impedance tuner of FIG. 2A can be utilized as an impedance tuner implemented between a radio circuit and an antenna.

FIG. 2B shows that in some embodiments, the impedance tuner 100 of FIG. 2A can be utilized as an impedance tuner 100 implemented between a radio circuit 102 and an antenna 104. For the purpose of description, it is assumed that the radio circuit 102 operates with a source impedance (e.g. Z0=50 ohms), and the antenna 104 presents a load impedance at an antenna node (ANT); and such a load impedance of the antenna 104 can vary (e.g., due to environmental factor(s)). For the purpose of description, it will be assumed that the load impedance presented at the antenna node (ANT) may or may not include a contribution from, for example, an antenna feedline.

Referring to FIG. 2B, the impedance tuner 100 can be implemented to match the load impedance of the antenna 104 to the source impedance Z0 or move the load impedance closer to the source impedance, so as to maximize or improve the power transfer between the radio circuit 102 and the antenna 104. For example, a power amplified radio-frequency (RF) signal can be generated by the radio circuit 102 for transmission through the antenna 104, and power transferred from the radio circuit 102 to the antenna 104 can be desirably maximized or increased when the load impedance of the antenna (ANT) is matched with or is closer to the source impedance Z0 of the radio circuit 102. In another example, a signal received through the antenna (ANT) can be efficiently transferred to the radio circuit 102 for processing, when the impedance of the antenna (ANT) is matched with or is closer to the impedance Z0 of the radio circuit 102.

Figure 3:
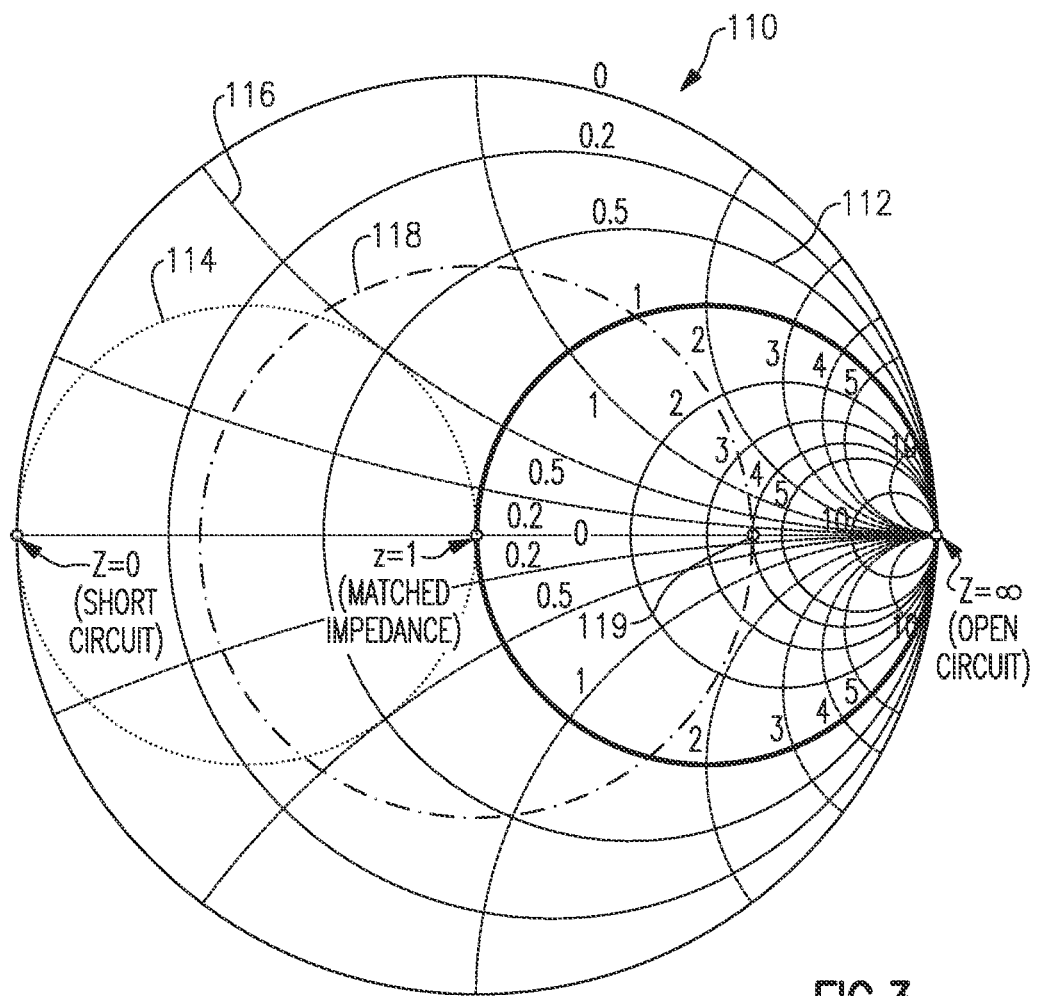
FIG. 3 is an example normalized Smith chart that provides a visual representation of an impedance Z=R+jX, where R is resistance and X is reactance.

FIG. 3 shows a normalized Smith chart 110 that provides a visual representation of an impedance Z=R+jX, where R is resistance and X is reactance. A horizontal line segment is shown to bisect the outermost circle, with the left end of the horizontal line segment representing a short circuit (Z=0) state, and the right end of the horizontal line segment representing an open circuit (Z=∞) state. The mid-point of the horizontal line segment (and thus the center of the outermost circle) represents a matched impedance state. Such a matched impedance state has a value of Z=1 in the normalized representation. In an un-normalized representation, such a matched impedance state can have a value of, for example, Z=50Ω.

The solid-line circles are constant-resistance circles 112 at example normalized values. For example, the outermost circle referenced above has a constant-resistance value of 0, and the successively smaller circles have constant-resistance values of 0.2, 0.5, 1, 2, 3, 4, 5 and 10. All of such constant-resistance circles share their right-most points at the right end of the above-referenced horizontal line segment (open circuit state).

In the normalized Smith chart 100 of FIG. 3, dash-line arcs are constant-reactance arcs 116 at example normalized values. For example, the above-referenced horizontal line segment (an arc of an infinite-radius circle) has a constant-reactance value of 0, and the successively smaller-radius-circle arcs have constant-reactance values of 0.2, 0.5, 1, 2, 3, 4, 5 and 10. Such constant-reactance arcs can be provided above and below the horizontal line segment. For the arcs above the horizontal line segment, the arcs share their lower-most points at the right end of the horizontal line segment (open circuit state). For the arcs below the horizontal line segment, the arcs share their upper-most points at the right end of the horizontal line segment (open circuit state).

In the normalized Smith chart 100 of FIG. 3, constant-conductance (G=1/R) circles (e.g., dotted circle 114) can also be provided similar to the constant-resistance circles, except that such constant-conductance circles share their left-most points at the left end of the above-referenced horizontal line segment (short circuit state). In FIG. 3, an example conductance circle is shown to have a normalized conductance value of 1.

In the normalized Smith chart 100 of FIG. 3, a constant-VSWR (voltage standing wave ratio) circle can be provided with a circle having its center at the matched-impedance point (Z=1). The right-most point of such a circle is on the above-referenced horizontal line segment, and the value of the constant-resistance circle intersecting such a point represents the constant VSWR value. For example, a dash-dot circle 118 intersects the horizontal line segment at a point together with the constant-resistance circle having a normalized value of 4. Thus, the constant-VSWR circle 118 has a normalized VSWR value of 4.

Figure 4:
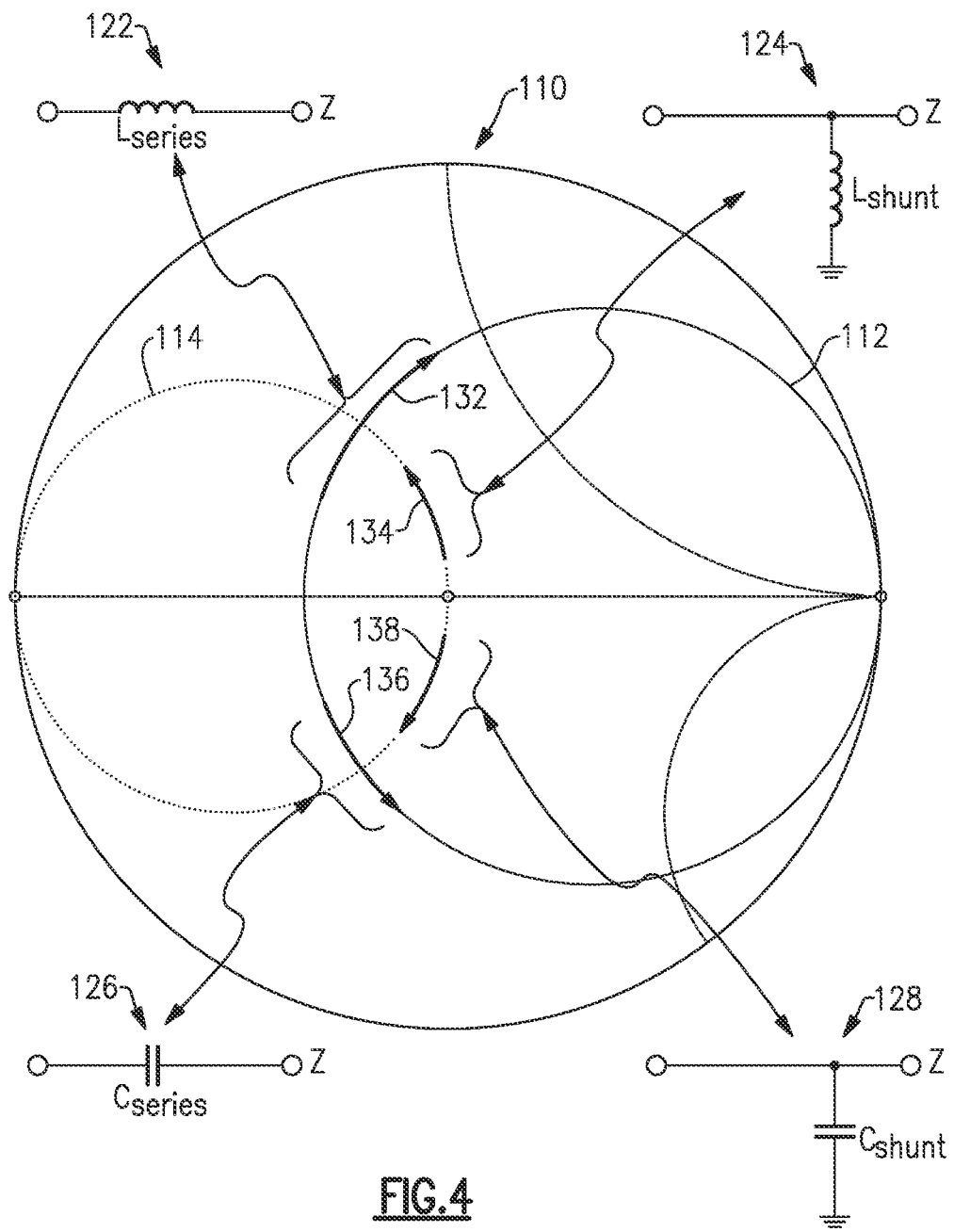
FIG. 4 is another example Smith chart that is similar to the example of FIG. 3, but with many of the constant-resistance circles and constant-reactance arcs removed for clarity.

FIG. 4 shows a Smith chart 110 that is similar to the example of FIG. 3, but with many of the constant-resistance circles and constant-reactance arcs removed for clarity. Referring to FIG. 4, suppose that at a given node of a signal path, a particular impedance (Z=R+jX) is presented. When an inductance (e.g., an inductor) or a capacitance (e.g., a capacitor) is introduced relative to the node, such an element results in the impedance to change along a constant-resistance circle or a constant-conductance circle.

For example, an introduction of a series inductance ($L_{series}$) 122 along the signal path has a tendency to change the impedance at the node from the original state (e.g., at the tail of an arc-arrow 132 on a constant-resistance circle 112) to another state at the tip of the arc-arrow 132 on the constant-resistance circle 112. Thus, $Z_{initial}=R_{constant}+jX_{initial}$, and $Z_{final}=R_{constant}+jX_{final}$, such that the change of Z along the constant-resistance circle is in the clockwise direction in the example Smith chart 110 of FIG. 4.

In another example, an introduction of a series capacitance ($C_{series}$) 126 along the signal path has a tendency to change the impedance at the node from the original state (e.g., at the tail of an arc-arrow 136 on a constant-resistance circle 112) to another state at the tip of the arc-arrow 136 on the constant-resistance circle 112. Thus, $Z_{initial}=R_{constant}+jX_{initial}$, and $Z_{final}=R_{constant}+jX_{final}$, such that the change of Z along the constant-resistance circle is in the counter-clockwise direction in the example Smith chart 110 of FIG. 4. It is noted that the series capacitance example is depicted on the same constant-resistance circle as the series inductance example for illustration purpose; however, it will be understood that initial impedances of the two examples may or may not be the same.

In yet another example, an introduction of a shunt inductance ($L_{shunt}$) 124 along the signal path has a tendency to change the impedance at the node from the original state (e.g., at the tail of an arc-arrow 134 on a constant-conductance circle 114) to another state at the tip of the arc-arrow 134 on the constant-conductance circle 114. Thus, in terms of admittance Y=G+jB (G=conductance and B=susceptance), with Y being the inverse of impedance (Y=1/Z), $Y_{initial}=G_{constant}+jB_{initial}$, and $Y_{final}=G_{constant}+jB_{final}$, such that the change of Y along the constant-conductance circle is in the counter-clockwise direction in the example Smith chart 110 of FIG. 4.

In yet another example, an introduction of a shunt capacitance ($C_{shunt}$) 128 along the signal path has a tendency to change the impedance at the node from the original state (e.g., at the tail of an arc-arrow 138 on a constant-conductance circle 114) to another state at the tip of the arc-arrow 138 on the constant-conductance circle 114. Thus, in terms of admittance Y=G+jB (G=conductance and B=susceptance), with Y being the inverse of impedance (Y=1/Z), $Y_{initial}=G_{constant}+jB_{initial}$, and $Y_{final}=G_{constant}+jB_{final}$, such that the change of Y along the constant-conductance circle is in the clockwise direction in the example Smith chart 110 of FIG. 4. It is noted that the shunt capacitance example is depicted on the same constant-conductance circle as the shunt inductance example for illustration purpose; however, it will be understood that initial impedances of the two examples may or may not be the same.

Although not shown in the example of FIG. 4, it is noted that an introduction of a resistance along the signal path has a tendency to change the impedance at the node from the original state to another state along a corresponding constant-reactance arc or a corresponding constant-susceptance arc. For example, a series resistance along the signal path has a tendency to change the impedance along the corresponding constant-reactance arc, towards the open circuit state. In another example, a shunt resistance along the signal path has a tendency to change the impedance along the corresponding constant-susceptance arc, towards the short circuit state. It is noted that constant-susceptance arcs can be provided relative to the constant-conductance circles, similar to the constant-reactance arcs/constant-resistance circles arrangement.

In some embodiments, an impedance tuner can be implemented along a signal path and be configured to provide matching of different load impedance states to a desired impedance state. Such a solution can be implemented utilizing a minimum or reduced number of electrical components (e.g., LC components).

Impedance Tuner with Reduced Distortion

There are a number of techniques that can be used to modulate signals for wireless communication. One such modulation technique is quadrature amplitude modulation (QAM), but other modulation techniques phase shift keying (PSK), bi-phase shift keying (BPSK), quadrature phase shift keying (QPSK or 4-PSK) can also be used. Higher-order modulation techniques may need increasing levels of precision to ensure that the wireless signal are not distorted. For example, the Wi-Fi standard IEEE 802.11 ax can use 256-QAM (or higher-order modulation), which can be sensitive to various sources of distortion. One source of distortion can include the power amplifier output match. Thus, a sufficiently accurate output match may be required for the power amplifier of a wireless communication system in order to ensure that the transmitted signal is not distorted.

It is therefore desirable to transmit signals modulated using high-order QAM (or other high-order modulation techniques) with very little distortion. One technique for measuring such distortion is Error Vector Magnitude (EVM). The EVM produced by an RF transmit power amplifier may be sensitive to the power amplifier's load impedance, necessitating small impedance adjustments during the design phase, or in production, or in the field.

Figure 5A:
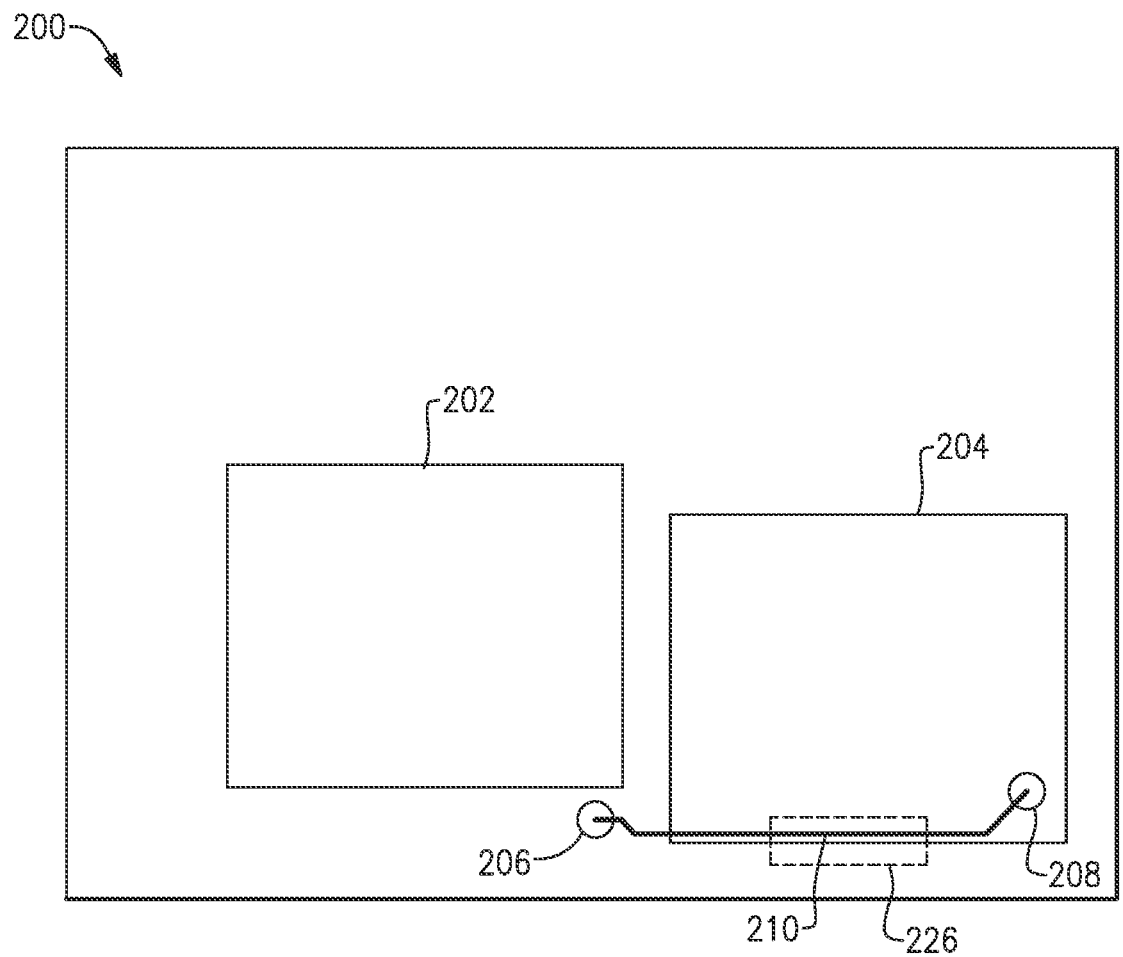
FIGS. 5A-5E include schematic diagrams of one embodiment of an RF system in accordance with aspects of this disclosure.
Figure 5B:
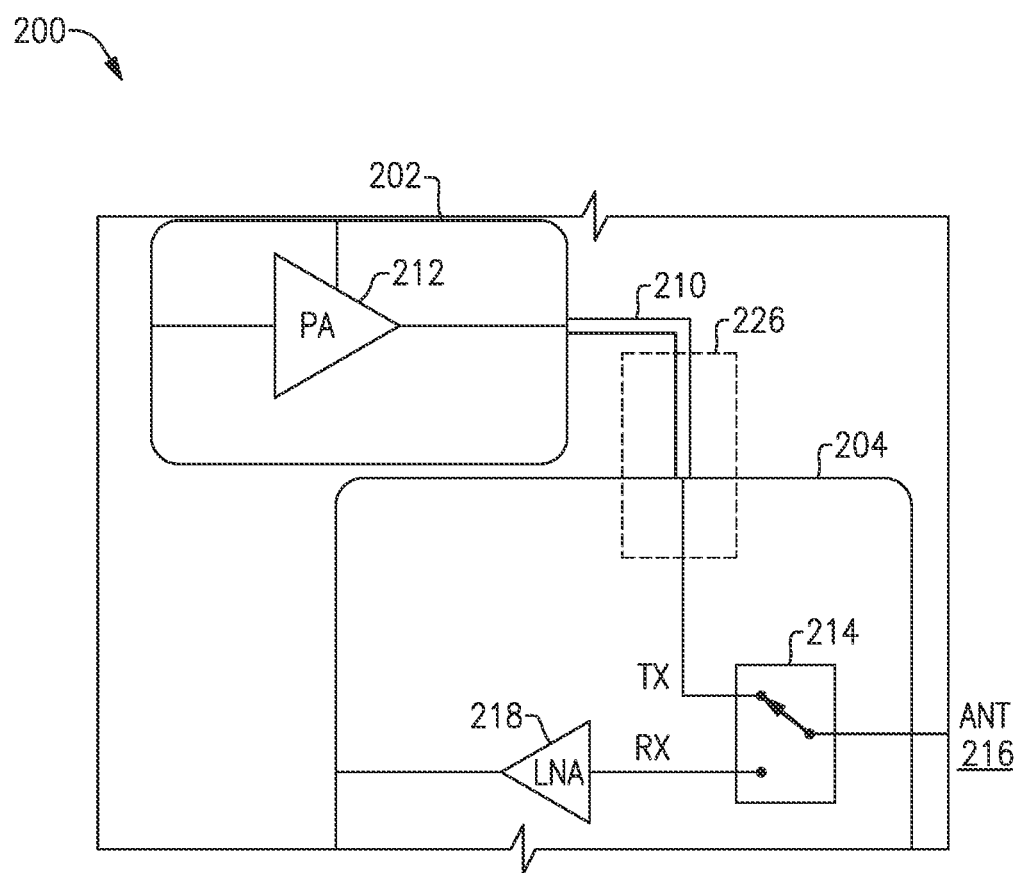
Figure 5C:
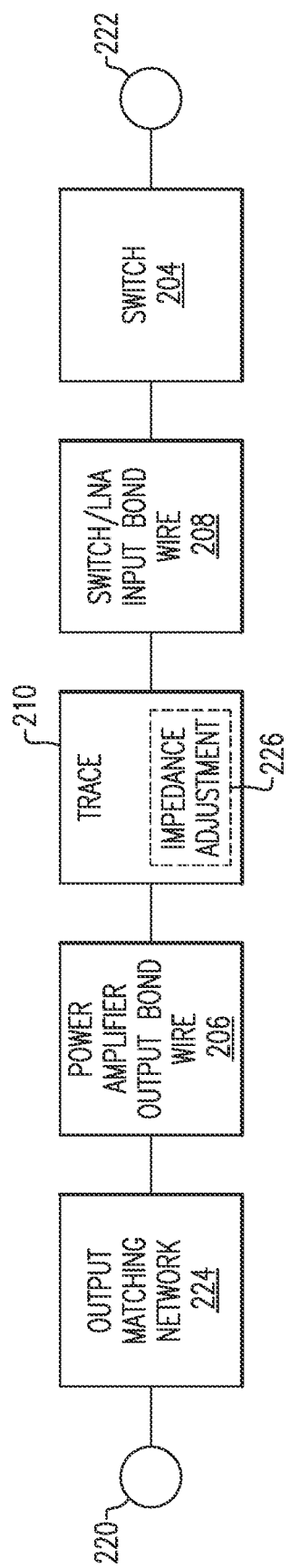

FIGS. 5A-5E include schematic diagrams of one embodiment of an RF system 200 in accordance with aspects of this disclosure. In particular, FIG. 5A illustrates the layout of the RF system 200, FIG. 5B is a partial schematic of the RF system 200, and FIG. 5C is a block diagram of the RF system 200. As shown in FIG. 5A, the RF system 200 includes a power amplifier die 202, a switch/low noise amplifier (LNA) die 204, a power amplifier output bond wire 206, a switch/LNA input bond wire 208, and a trace 210 connecting the power amplifier output bond wire 206 to the switch/LNA input bond wire 208. In addition, the RF system 200 can further include an impedance adjustment circuit 226 that is configured to adjust the impedance between the power amplifier die 202 and the switch/LNA die 204, which can improve the impedance match therebetween.

With reference to the schematic diagram of FIG. 5B, the power amplifier die 202 includes a power amplifier 212 and the LNA die 204 includes a switch 214 and an LNA 218. The power amplifier 212 is configured to amplify an RF signal and output the amplified RF signal to a transmit terminal TX of the switch 214. The switch is configured to connect one of the transmit terminal TX and a receive terminal RX to an antenna ANT 216. For example, when the RF system is operating in a transmit mode, the switch can connect the antenna ANT 216 to the transmit path and thus to the power amplifier 212, and when the RF system is operating in a receive mode, the switch can connect the antenna ANT 216 to the receive path and thus to the LNA 218.

The power amplifier output 220 can be connected to the input of the switch 222 as shown conceptually in the block diagram of FIG. 5C. While certain components are illustrated via various blocks in FIG. 5C, two or more of the illustrated blocks can be implemented by a single component and/or a single block can be implemented using a plurality of components depending on the embodiment.

Although not illustrated in FIGS. 5A and 5B, the power amplifier die 202 may also include an output matching network 224 connected between the power amplifier output 220 and the power amplifier output bond wire 206. The output matching network 224 is configured to adjust the output impedance of the power amplifier 212 to match the input impedance of the switch 214. The output matching network 224 may not be adjustable after the device has been manufactured. Thus, it may not be possible to adjust the output match of the power amplifier using the output matching network 224 to compensate for any minor variances that occurring during production or in use.

During the design of a power amplifier, impedance adjustments can be accomplished by changing out surface-mount elements (e.g., inductors or capacitors) to find the right impedance that minimizes EVM. In production, power amplifiers may have to be screened for EVM leading to yield loss since an EVM over a certain threshold value may result in unacceptable levels of distortion. Specifically, when the power amplifier is used in an RF system that employs high-order QAM, there may be a relatively tight EVM requirement compared to other modulation techniques. As described above, the EVM of a power amplifier is affected by the power amplifier output match. For example, the better the output match provided to the power amplifier output, the lower the EVM measurement of distortion.

The power amplifier output bond wire 206 can be used as one variable to adjust impedance for the output match. For example, the physical configuration of the bond wire 206 may affect the impedance value of the bond wire 206 which can be adjusted to adjust the output match of the power amplifier 212. However, adjusting the output match by changing the physical characteristics of the bond wire 206 may be difficult and slow process. In addition, the physical characteristics of the bond wire 206 may not be adjustable after production, such that the output match cannot be adjusted post-production.

Aspects of this disclosure relate to an impedance adjustment that can be used to adjust output match of the power amplifier 212 intra- and/or post-production. As illustrated in FIGS. 5A-5C, the trace 210 connects the power amplifier output bond wire 206 to the switch die 204 (e.g., via a switch/LNA input bond wire 208). In the illustrated embodiment, the trace 210 further includes the impedance adjustment circuit 226 that is configured to adjust the impedance between the power amplifier 212 and the switch 214, which can improve the impedance match therebetween.

The impedance adjustment circuit 226 can be configured to provide a programmable impedance tuning to the power amplifier output 220, which can be adjusted to find the lowest EVM and thereby minimize distortion. One design consideration for an impedance adjustment circuit 226 is to minimize the amount of insertion loss added by the impedance adjustment circuit 226. Another design consideration is to minimize the cost and size of the impedance adjustment circuit 226.

For example, the impedance adjustment circuit 226 can be embodied as a general-purpose impedance tuner (capable of covering a large area of the smith chart), however, such general-purpose impedance tuners require many LC elements, and many switches, and therefore presents more loss that is typically acceptable for many RF applications. In some embodiments, the impedance adjustment circuit 226 can provide relatively small impedance adjustment before the input bond wire 208 of the switch/low noise amplifier (LNA) die 204 compared to the general-purpose tuner. The impedance adjustment circuit 226 can be used during production testing to fuse every part to help in minimizing EVM. The fusing of every part may refer to a fusing process (also referred to as "factory calibration") at the end of the production line in which every part (e.g., production module) is individually tested and adjusted, with the final adjustment then remaining permanent. In this context, the fusing process can include measuring the EVM of the RF system's output signal with every possible setting of the impedance adjustment circuit 226, and then setting the impedance adjustment circuit 226 to the state that resulted in the lowest measured EVM. In other embodiments, instead of performing a fusing process, the end user may be allowed to program different settings for the impedance adjustment circuit 226 at any time for the life of the RF system 200 in the system's 200 end use.

In order to address the above-indicated design considerations, in some embodiments, the impedance adjustment circuit 226 can be implemented using minimal added hardware. For example, the impedance adjustment circuit 226 can be implemented using as few as two switches in certain embodiments. However, in other embodiments, the impedance adjustment circuit 226 may include one, three, four, or more switches. In order to limit the number of added components, in certain embodiments, the impedance adjustment circuit 226 can have an adjustable impedance providing a limited number of adjusted states, which may define a circle on the Smith Chart. For example, in some embodiments, the impedance adjustment circuit 226 can provide four adjusted states, however, a greater or fewer number of adjusted states can be provided in other embodiments. In some embodiments, the adjusted state of the impedance adjustment circuit 226 can be selected by mobile industry processor interface (MIPI) on the silicon on insulator (SOI), for example, on the substrate on which the RF system 200 is formed.

Aspects of this disclosure relate to a impedance adjustment circuit 226 that can introduce insertion loss at levels of much less than 0.5 dB. The impedance adjustment circuit 226 can enable impedance tuning in order to reduce the EVM measurement. In at least some embodiments, the improvement in the EVM provided by tuning using the impedance adjustment circuit 226 can compensate for the insertion loss introduced by the impedance adjustment circuit 226 by reducing need for backoff. As used herein, backoff may generally refer to the amount to which the power amplifier's 212 output power must be reduced to avoid excessive distortion. Backoff is typically quantified in dB. The reference point is the power amplifier's 212 saturation power, which is the limit of how much power can come out of the power amplifier 212 as the input is driven higher and higher. For an application such as WiFi, the power amplifier 212 power output may need to be "backed off" typically 10 dB or so below the saturation power. As the power is backed off, the EVM gets lower. In certain implementations, for a given type of signal designers may determine how much backoff is needed to achieve a certain EVM. However, one drawback to this process is that more backoff results in lower power efficiency, and thus, it is desirable to use as little backoff as possible to increase the power efficiency.

Figure 5D:
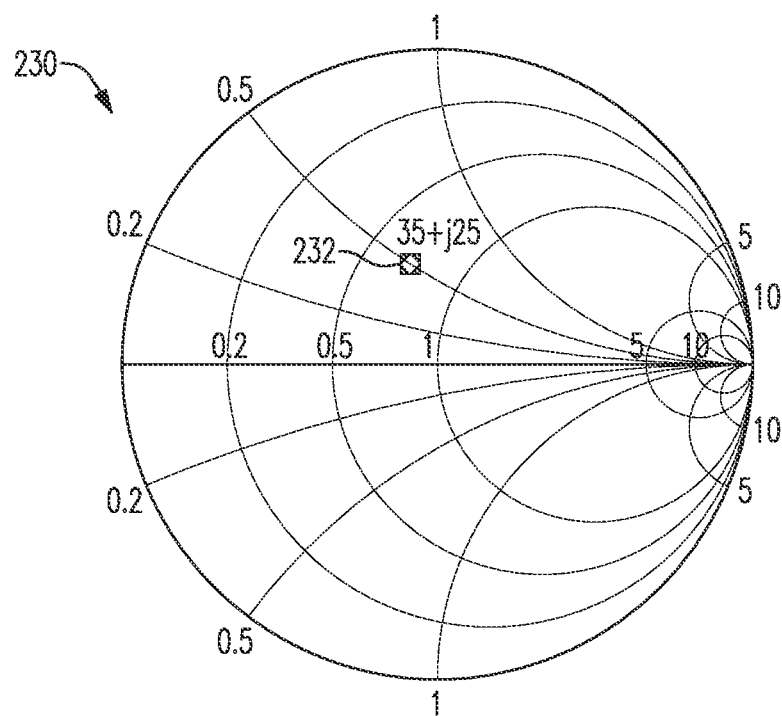
Figure 5E:
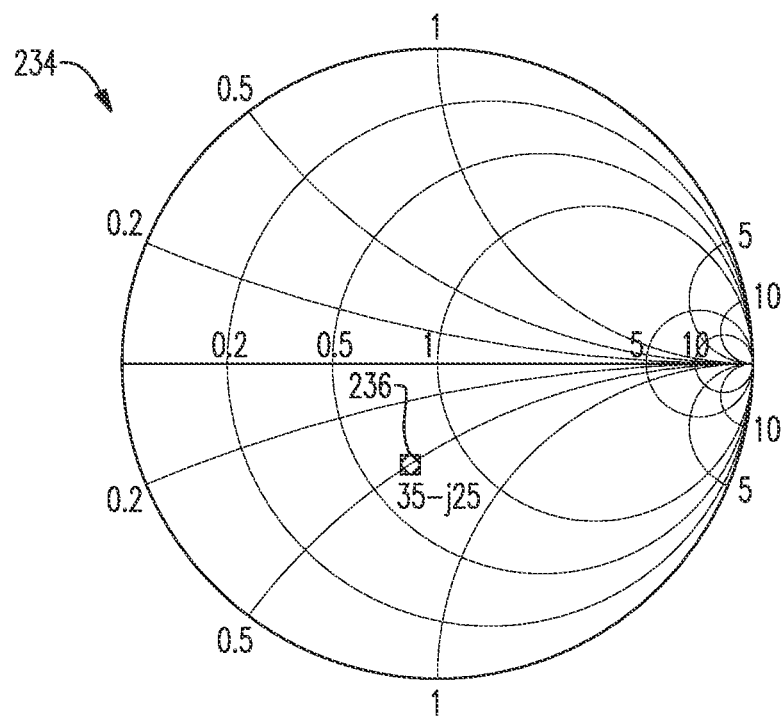

In some embodiments, the impedance adjustment circuit 226 can be inserted between ends of the trace 210 connecting the power amplifier output bond wire 206 to the switch/LNA input bond wire 208 as shown in the example of FIG. 5C and FIG. 10A. However, in other embodiments, the impedance adjustment circuit 226 can be placed, partially or completely, on one or more of the power amplifier die 202 and the switch/LNA die 204, for example, as shown in FIG. 11, certain components of the impedance adjustment circuit 226 can be incorporated onto the switch/LNA die 204. FIG. 5D is an example Smith chart 230 illustrating an example of the impedance 232 into the power amplifier 212 and FIG. 5E is an example Smith chart 234 illustrating an example of the impedance 236 into the switch 214. In one example as shown in FIGS. 5D and 5E, the impedance 232 into the power amplifier 212 is 35+j25Ω and the impedance 236 into the switch 214 is 35-25Ω.

Figure 6:
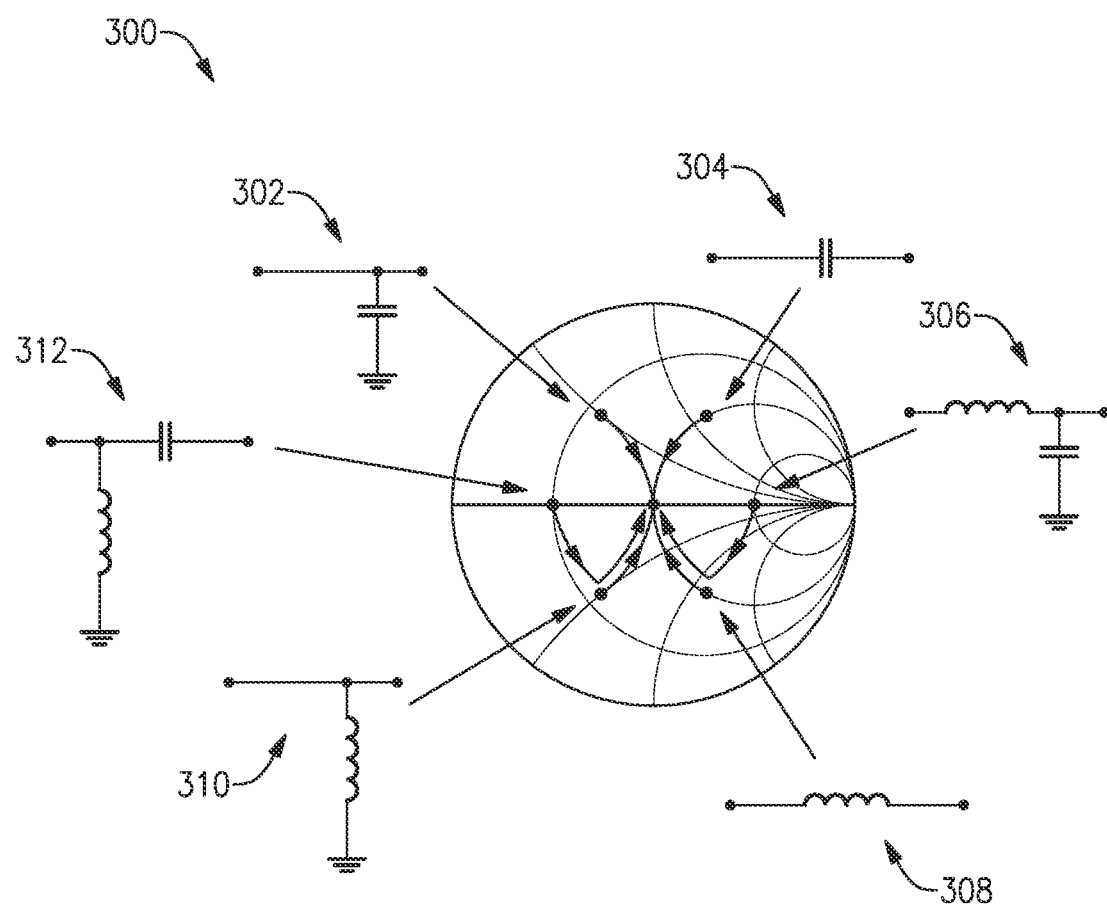
FIG. 6 is an example normalized Smith chart that provides a visual representation of the impedance effects of certain components for an example impedance adjustment circuit.

FIG. 6 is an example normalized Smith chart 300 that provides a visual representation of the impedance effects of certain components 302-312 for an example impedance adjustment circuit 226. For example, the impedance effects for each combination of a capacitor and/or an inductor 302-312 arranged in series or in parallel with an antenna are shown on the Smith chart 300. An example impedance matching adjustment circuit 226 which is able to be selectively connected into each of the illustrated LC topologies would require a relatively large number of switches and electrical components (such as LC components), resulting in relatively high insertion loss. Thus, in certain embodiments, the number of switches and LC components are reduced, thereby reducing the insertion loss and improving the EVM measurement of distortion.

Figure 7:
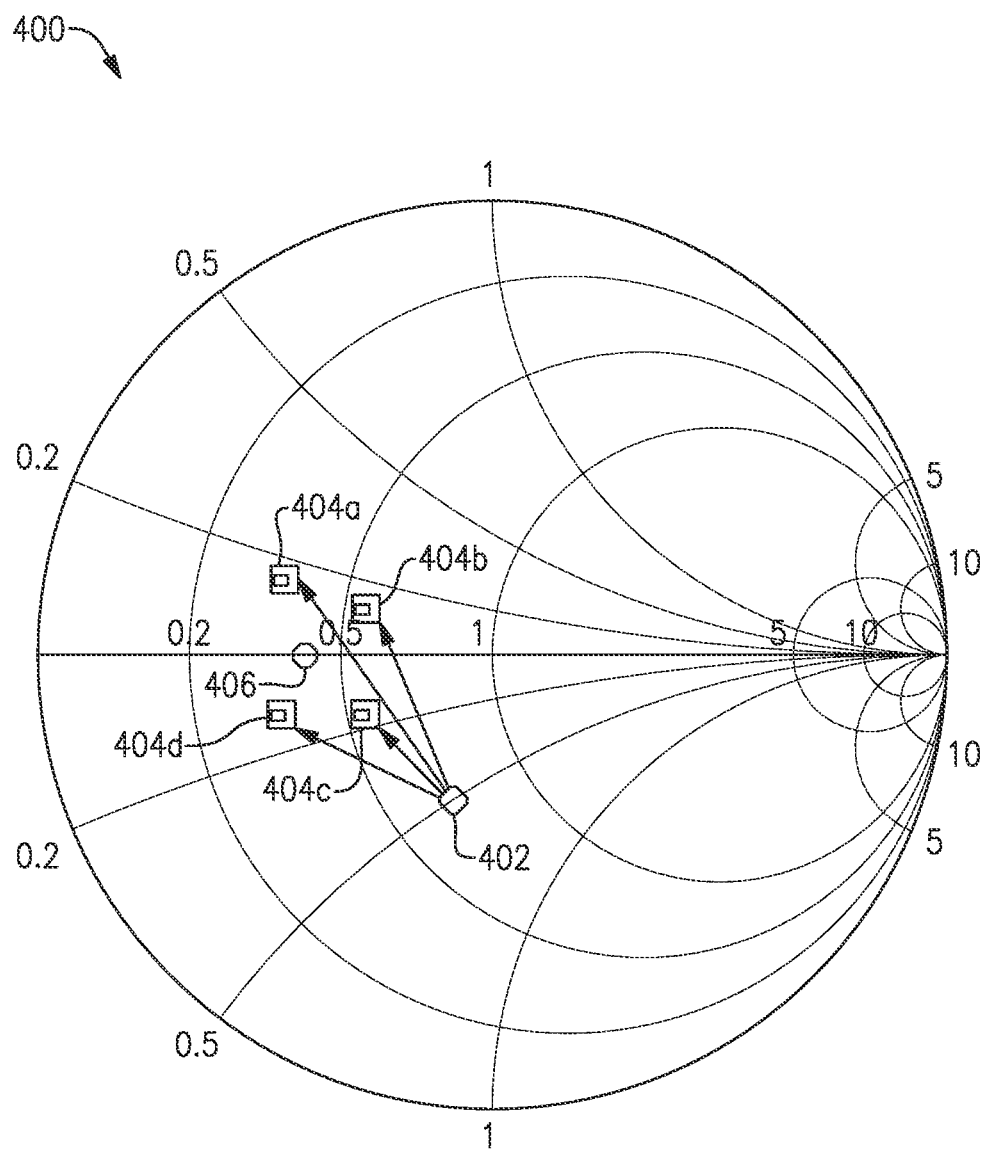
FIG. 7 is an example normalized Smith chart that provides a visual representation of the impedance effects for a simplified example impedance adjustment circuit in accordance with aspects of this disclosure.

FIG. 7 is an example normalized Smith chart 400 that provides a visual representation of the impedance effects for a simplified example impedance adjustment circuit 226 in accordance with aspects of this disclosure. In particular, the number of switches and components required to create the impedance adjustment circuit 226 can be reduced by adjusting the impedance in substantially the same direction for each possible state of the impedance adjustment circuit 226. In the example of FIG. 7, the natural tune point 402 of the power amplifier 212 and the switch 214 can be biased to one side of the Smith chart such that tuning the impedance by different value in substantially the same direction moves the impedance closer to a nominal tuned impedance point 406 (e.g., a bisecting value along the horizontal real line with a constant reactance of 0). In the illustrated embodiment, the impedance adjustment circuit 226 may have a single LC topology configured to provide 2 inductance values and 2 capacitance values, for a total of 4 states 404a-404d. Each of these states may adjust the impedance value in substantially the same direction, covering a small zone of Smith chart 400 near the nominal impedance point 406.

Figure 8:
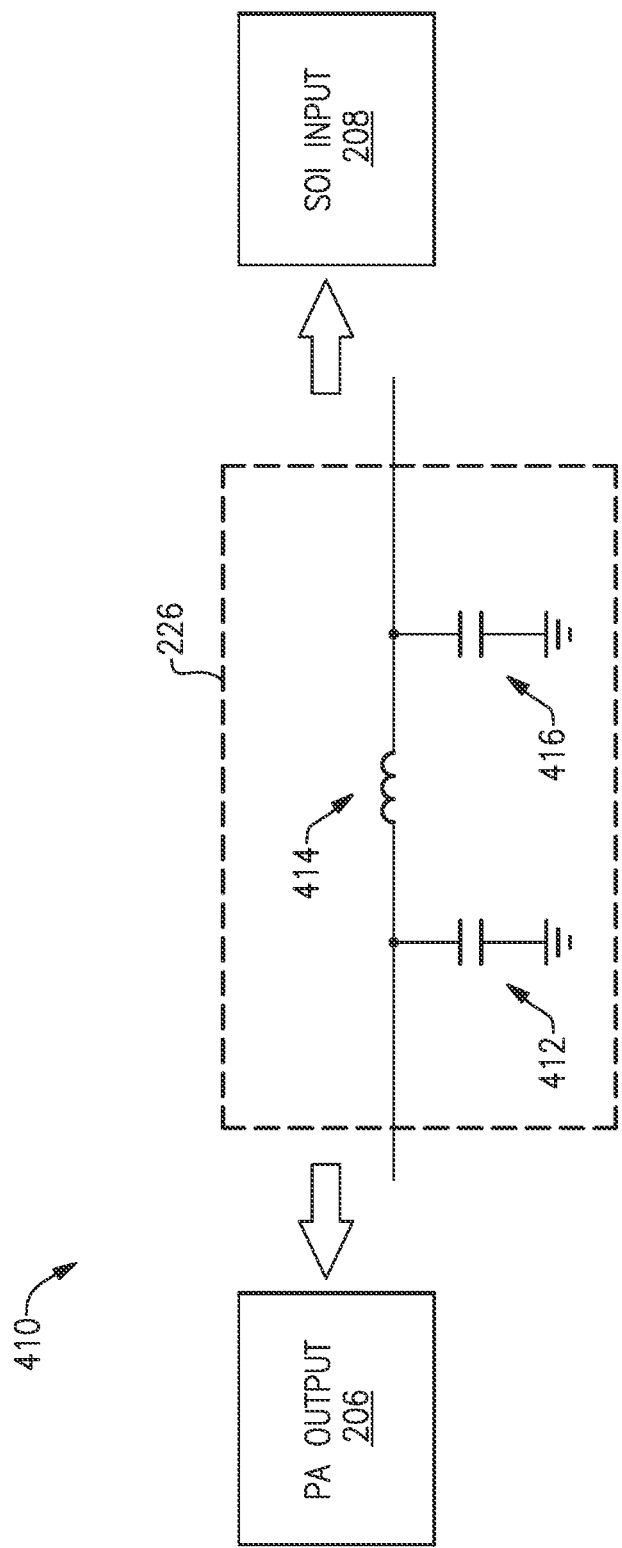
FIG. 8 is an example state of the impedance adjustment circuit in accordance with aspects of this disclosure.

FIG. 8 is an example state 410 of the impedance adjustment circuit 226 in accordance with aspects of this disclosure. In particular, the impedance adjustment circuit 266 illustrated in FIG. 8 is a 3-pole low pass filter including a first capacitor 412 connected between the power amplifier output bond wire 206 and ground, an inductor 414 connected between the power amplifier bond wire 206 and the switch/LNA input bond wire 208, and a second capacitor 416 connected between the switch/LNA input bond wire 208 and ground. In one example, the first capacitor 412 has a value of 1.00 pF, the second capacitor 416 has a value of 0.30 pF, and the inductor 414 has a value of 1.48 nH.

Figure 9A:
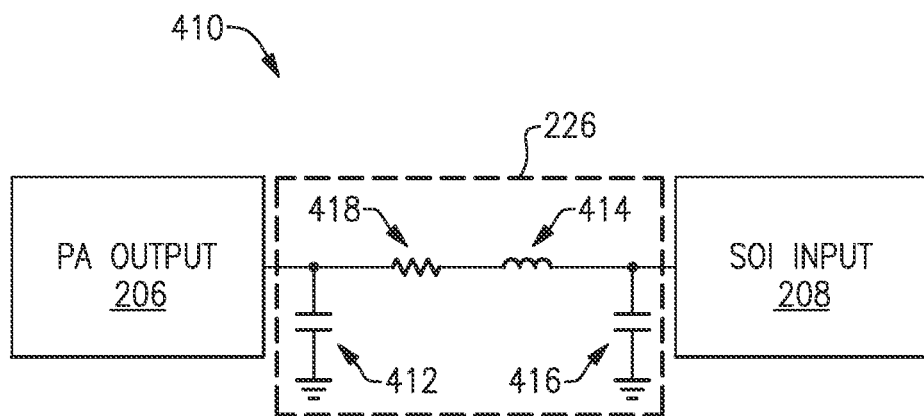
FIGS. 9A-9C illustrate the results of a simulation of the impedance adjustment circuit of FIG. 8.
Figure 9B:
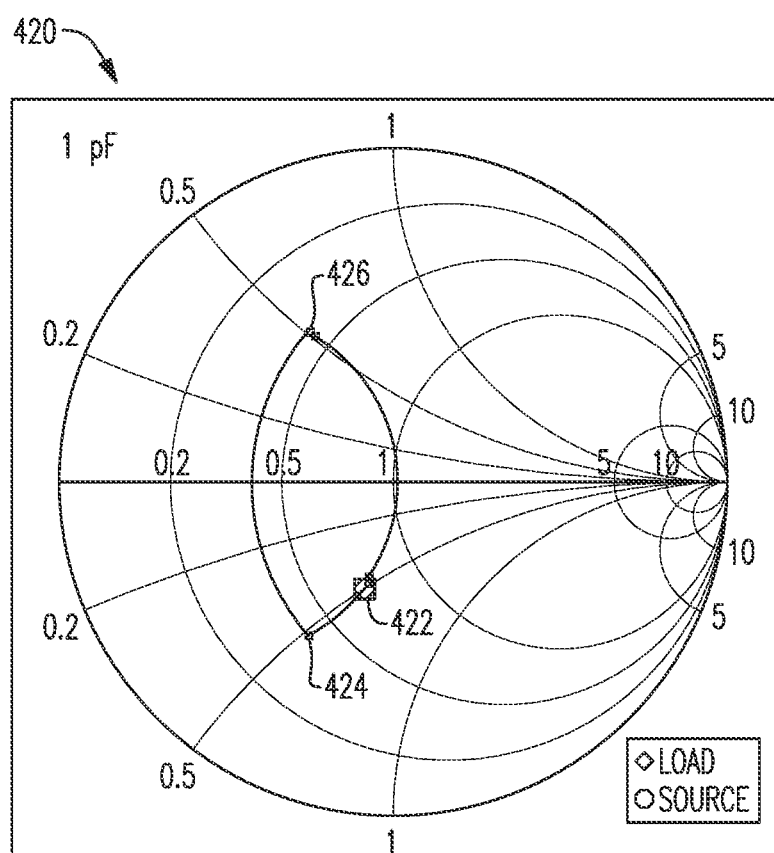
Figure 9C:
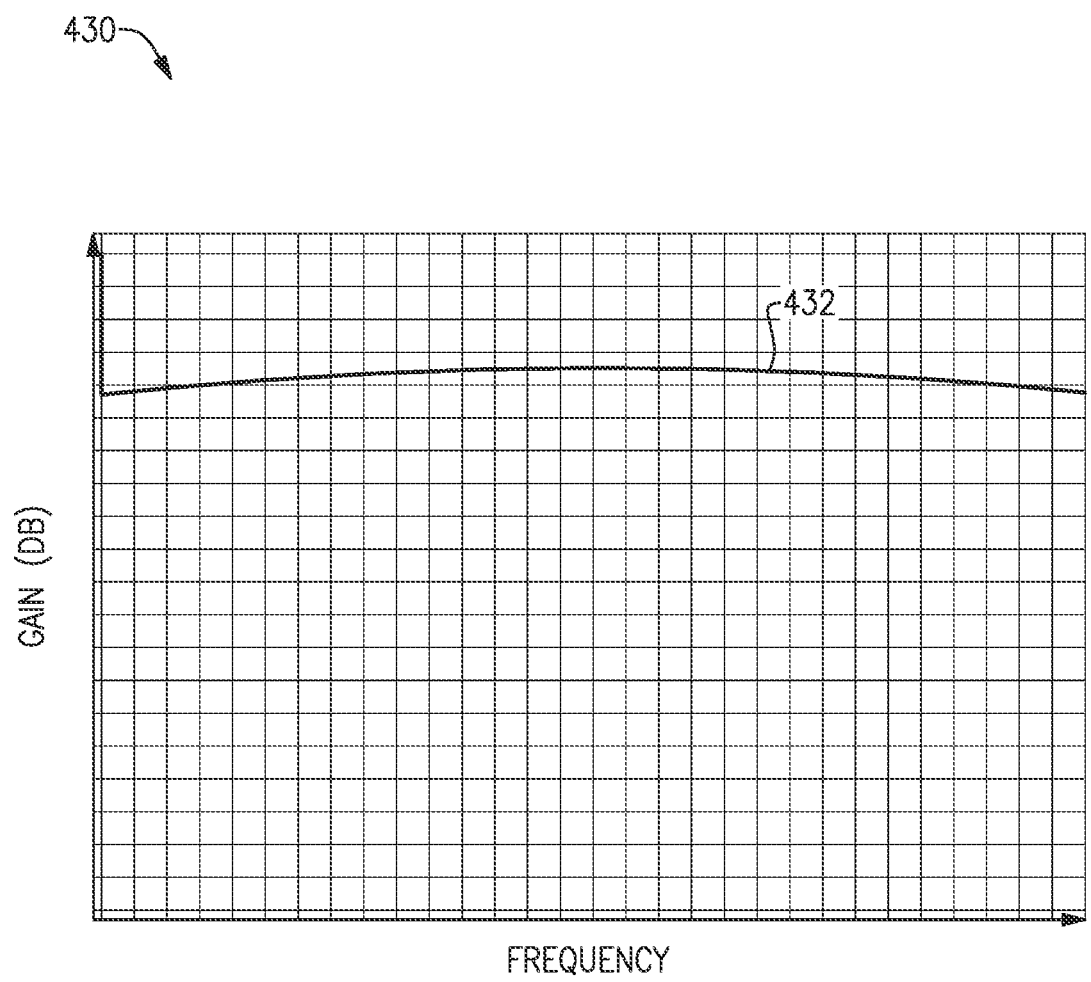

FIGS. 9A-9C illustrate the results of a simulation of the impedance adjustment circuit 226 of FIG. 8. In particular, FIG. 9A the impedance adjustment circuit 226 includes the first capacitor 412, the inductor 414, and the second capacitor 416 connected between the switch/LNA input bond wire 208 and ground. In addition, a resistance 418 of the impedance adjustment circuit 226 is included in the model.

FIG. 9B is an example normalized Smith chart 420 that provides a visual representation of the impedance effects for the modeled impedance adjustment circuit 226 of FIG. 9A. In the Smith chart 420, the starting point 422 may correspond to the natural tune point of the power amplifier 212 and may be biased to one side of the Smith chart 420 similar to the example natural tune point 402 in FIG. 7.

The second capacitor 416 may provide a shunt capacitance that moves the impedance to a first impedance point 424. The inductor 418 may provide a series inductance that moves the impedance to a second impedance point 426. The first capacitor 412 may provide a shunt capacitance that moves the impedance back to the starting point 422.

FIG. 9C is an example graph 430 showing the network response of the modeled impedance adjustment circuit 226 of FIG. 9A. In particular, the plot 432 illustrates the gain (dB) of the impedance adjustment circuit 226 over a range of simulated frequencies. In one example, the plot 432 has about 0.1 dB S21 ripple over a frequency range of about 5 GHz-6 Ghz.

FIG. 10A is a schematic diagram of one embodiment of an RF system 500 in accordance with aspects of this disclosure. The RF system 500 includes a power amplifier die 202, a switch/LNA die 204, a power amplifier output bond wire 206, a switch/LNA input bond wire 208, a first trace 210a, a second trace 210b, and an impedance adjustment circuit 226. In the embodiment of FIG. 10A, the impedance adjustment circuit 226 includes a first capacitor, a first inductor 504, a second inductor 506, and a second capacitor 508. The first and second inductors 504 and 506 are connected in series between the first and second traces 210a and 210b. Thus, the first and second inductors 504 and 506 may function as series elements. For example, the first trace 210a may function as an input node and the second trace 210b may function as an output node of the impedance adjustment circuit 226. However, in other embodiments, a portion of the impedance adjustment circuit 226 may be formed on the power amplifier die 202 and/or the switch/LNA die 204, and thus, the input/output nodes of the impedance adjustment circuit 226 may be located at positions other than the first and second traces 210a and 510b.

The first capacitor 502 is connected between the first trace 502 and ground and the second capacitor 508 is connected between the second trace 210b and ground. Thus, the first and second capacitors may function as shunt elements. In the illustrated embodiment the second inductor 506 and the second capacitor 508 may be tunable components. As shown below in FIG. 11, the tunable second inductor 506 and second capacitor 508 can be implemented by selectively connecting the second inductor 506 and the second capacitor 508 via one or more switches. In some embodiments, the LC components 502-508 are not implemented using surface mount technology (SMT). For example, the first and second inductors 504 and 506 can be implemented as traces on multi-chip-module (MCM) and the first and second capacitors 502 and 508 can be implemented as metal insulator metal (MIM) capacitors on the switch/LNA die 204.

Although not illustrated, the impedance adjustment circuit 226 may further include one or more switches configured to selectively connect one or more of the first and second capacitors 502 and 508 and the first and second inductors 504 and 506 to the trace 210. As described above, the insertion loss of the impedance adjustment circuit 226 can be affected by the number of components in the impedance adjustment circuit 226 including any switches required to connect/disconnect the LC components 502-508 and the LC components 502-508 themselves. Thus, in some embodiments, the number of components used to implement the impedance adjustment circuit 226 can be reduced, for example, by using the power amplifier output and switch/LNA input bond wires 206 and 208 and/or the first and second traces 210a and 210b to implement at least a portion of the impedance adjustment circuit 226. For example, the second trace 210b can be patterned to provide one or more of the first and second inductors 504 and 506, reducing the footprint of the impedance adjustment circuit 226 and/or the insertion loss introduced due the addition of LC components.

Figure 10B:
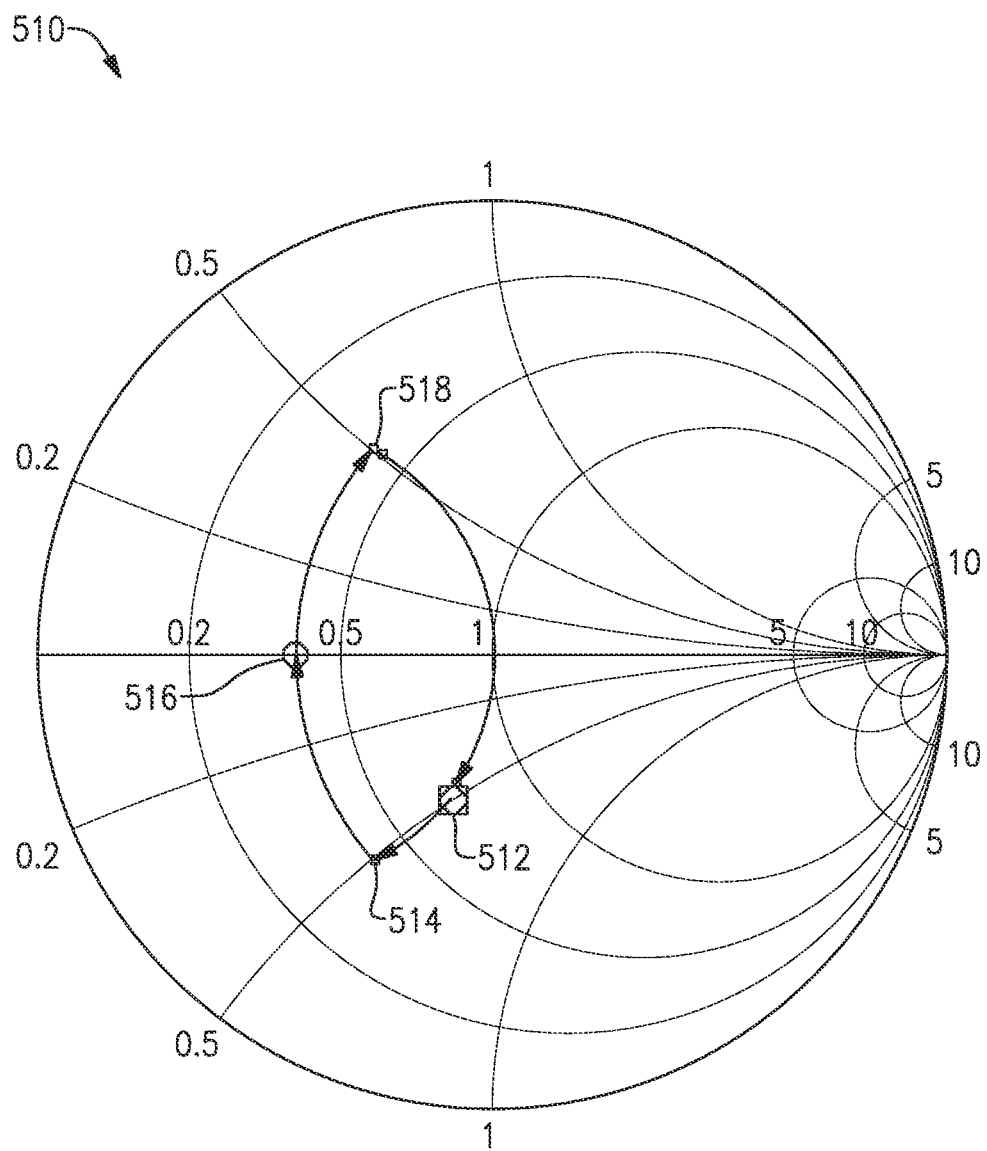
FIG. 10B is an example normalized Smith chart that provides a visual representation of the impedance effects for the impedance adjustment circuit of FIG. 10A.
Figure 11:
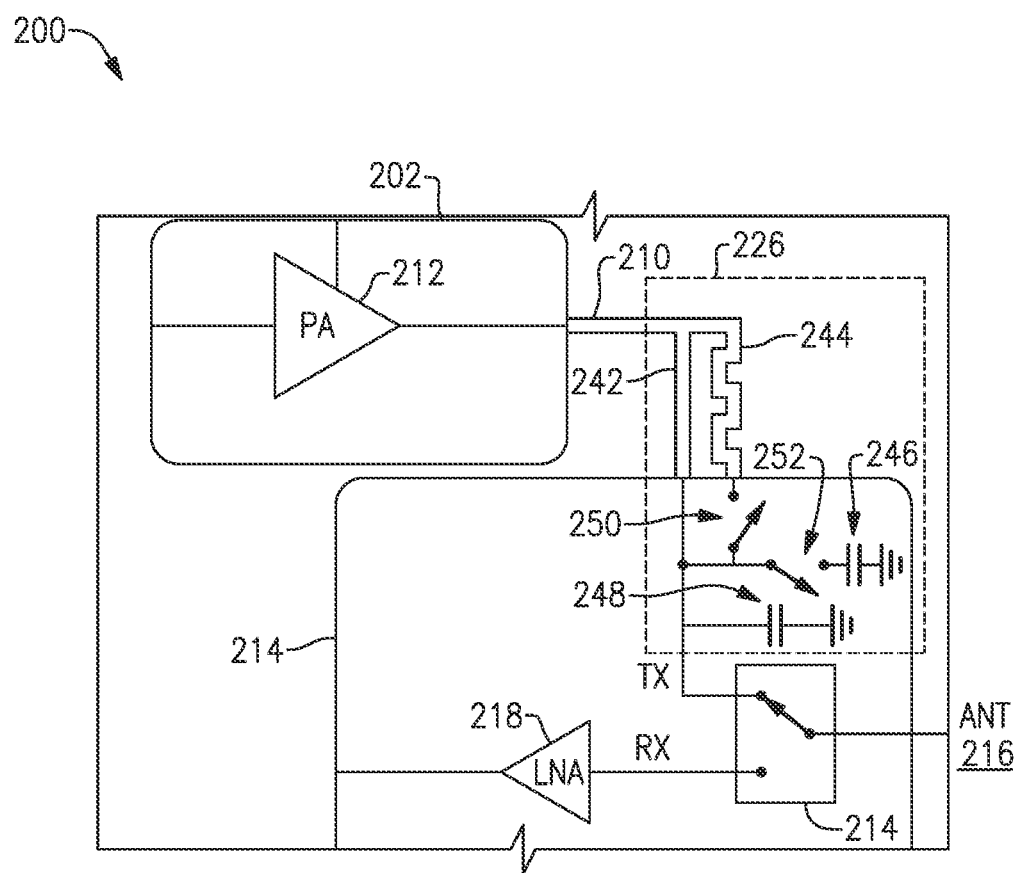
FIG. 11 is a schematic diagrams of one embodiment of an RF system including a schematic diagram of an embodiment of a impedance adjustment circuit in accordance with aspects of this disclosure.

FIG. 10B is an example normalized Smith chart 510 that provides a visual representation of the impedance effects for the impedance adjustment circuit 226 of FIG. 10A. In the Smith chart 510, the starting point 512 may correspond to the natural tune point of the power amplifier 212 and may be biased to one side of the Smith chart 510 similar to the example natural tune point 402 in FIG. 7.

The second capacitor 508 may provide a shunt capacitance that moves the impedance to the first impedance point 514. The second inductor 506 may provide a series inductance that moves the impedance to the second impedance point 516, which may be a bisection point at a point of all-real impedance (e.g., having a value of 21Ω in one example). However, the bisection point may be provided at any other point in the Smith chart 510 according to the design of the impedance adjustment circuit 226. The first inductor 504 may provide a series inductance that moves the impedance to the third impedance point 518. Lastly, the first capacitor 502 may provide a shunt capacitance that moves the impedance back to the starting point 512.

FIG. 11 is a schematic diagrams of one embodiment of an RF system 200 including a schematic diagram of an embodiment of a impedance adjustment circuit 226 in accordance with aspects of this disclosure. Similar to FIG. 5B, the RF system 200 includes a power amplifier die 202, a switch/low noise amplifier (LNA) die 204, a power amplifier output bond wire 206, a switch/LNA input bond wire 208, and a trace 210 connecting the power amplifier output bond wire 206 to the switch/LNA input bond wire 208.

As shown in FIG. 11, the trace 210 can be split into a first branch 242 and a second branch 244. The first and second branches 242 and 244 of the trace 210 may be formed to provide different series inductances. In particular, the MCM trace 210 can be formed in the first and second branches 242 and 244 to provide two separate inductance values. For example, in one implementation the first branch 242 may have an inductance of 0.94 nH and the second branch 244 may have an inductance of 1.27 nH. Of course, may other values can be selected for the inductances of the first and second branches 242 and 244 in other embodiments.

The impedance adjustment circuit 226 also includes a first capacitor 246 and a second capacitor 248, each of which is separately connected between the trace 210 and ground to provide a shunt capacitance. The first capacitor 246 may have a capacitance of 0.25 pF and the second capacitor 248 may have a capacitance of 0.015 pF. Of course, may other values can be selected for the capacitances of the first and second capacitors 246 and 248 in other embodiments.

Figure 12:
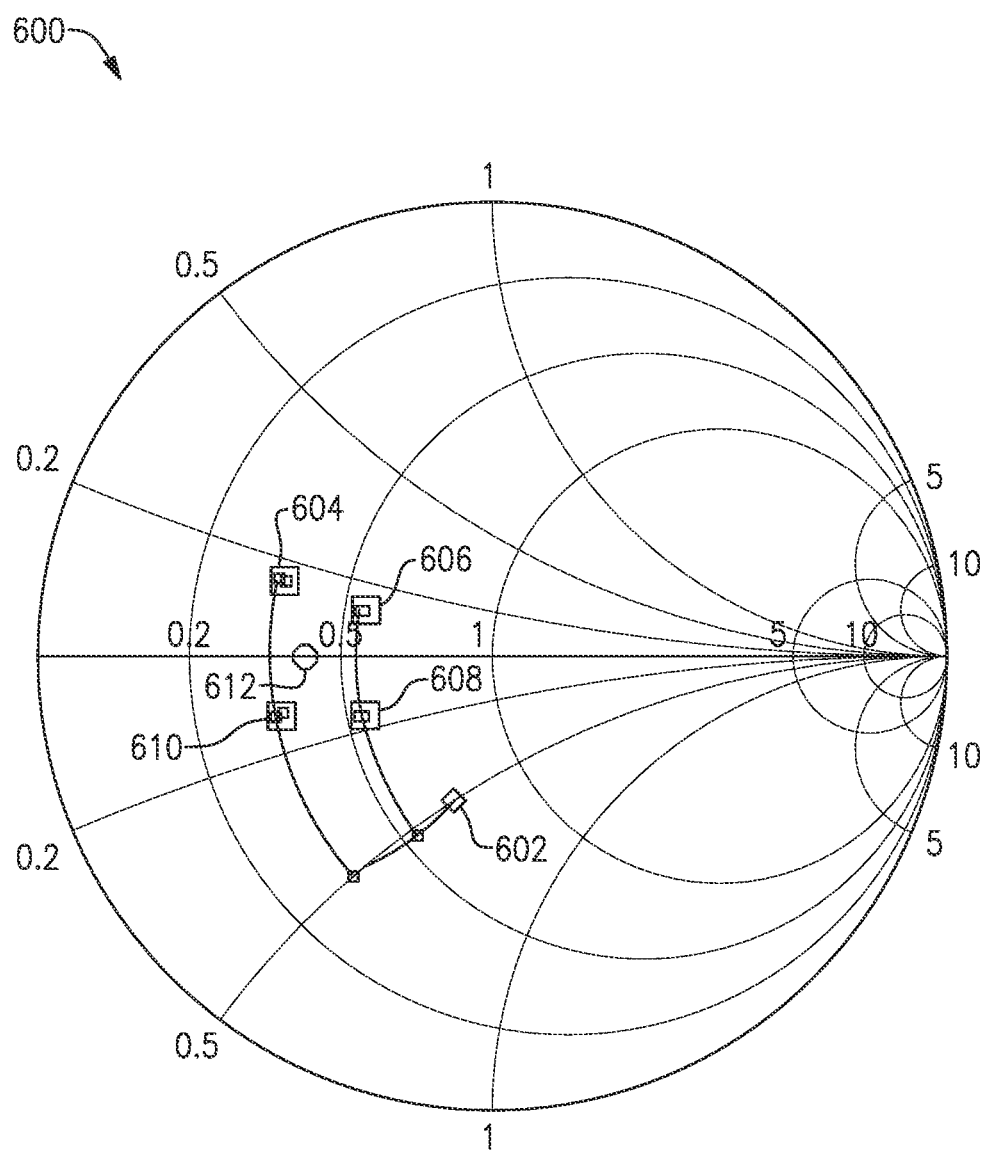
FIG. 12 is an example normalized Smith chart that provides a visual representation of the impedance effects for the impedance adjustment circuit of FIG. 11.

The impedance adjustment circuit 226 further includes a first switch 250 and a second switch 252. The first switch 250 is configured to selectively connect the second branch 244 in parallel to the first branch 242. The second switch 252 is configured to selectively connect the first capacitor 246 to the trace 210. The effective inductance of the impedance adjustment circuit 226 can be adjusted between an effective value of 0.54 nH and 0.94 nH based on the state of the first switch 250. Similarly, the effective capacitance of the impedance adjustment circuit 226 can be adjusted between an effective value of 0.15 pF and 0.40 pF based on the state of the second switch 248. Using the two switches 252 and 248, the effective impedance of the impedance adjustment circuit 226 can be adjust between four difference values, as illustrated in FIG. 12.

As shown in FIG. 11, in order to implement the impedance adjustment circuit 226 of this embodiment, the switch/LNA die 214 includes a new SOI layout, including an additional bump 254 connecting the second branch 244 of the trace 210 to the switch 250, the first and second switches 250 and 252 and two MIM capacitors 246 and 248.

The amplified RF signal received from the power amplifier 212 does not need to pass through a series switch unless the first and second branches 242 and 244 of the trace 210 are connected in parallel via the first switch 250. Since passing the signal through a series switch can negatively impact the insertion loss of the impedance adjustment circuit 226, avoiding transmitting the RF signal through a series switch for three of the four states of the impedance adjustment circuit 226 improves the insertion loss of the circuit 226.

The impedance adjustment circuit 226 of FIG. 11 is configured to cover a 2-dimensional area of the Smith chart, and can be configured to match in substantially the same direction for each state of the impedance adjustment circuit 226. Thus, the impedance adjustment circuit 226 can be implemented using a fixed-topology 2-element matching circuit to cover the area using only two switches. In addition, the insertion loss of the impedance adjustment circuit 226 can be minimized by creating a topology where the RF signal does not have to pass through any series switches on the main signal path (e.g., along the first branch 242 of the trace 210 to the input of the switch 214.

Aspects of this disclosure can thus provide EVM minimization, with minimal penalty to signal loss and system cost in at least each of the following scenarios: (1) in the design phase, without the need for soldering/desoldering components, (2) in production, where EVM can be tested and the best tune state permanently saved on the device by fusing or other non-volatile memory, and (3) in field use, to reduce EVM on demand, in any system that has feedback for measuring its own EVM.

FIG. 12 is an example normalized Smith chart 600 that provides a visual representation of the impedance effects for the impedance adjustment circuit 226 of FIG. 11. In the Smith chart 600, the starting point 602 may correspond to the natural tune point of the power amplifier 212 and may be biased to one side of the Smith chart 600 similar to the example natural tune point 402 in FIG. 7 and the starting point 512 of FIG. 10B.

The first to fourth impedance points each correspond to one of the possible states of the impedance adjustment circuit 226 of FIG. 11. For example, when the first switch 250 is open and the second switch 252 is closed, the impedance adjustment circuit 226 can tune the impedance to the first point 604. When the first switch 250 is open and the second switch 252 is open, the impedance adjustment circuit 226 can tune the impedance to the second point 606. Similarly, when the first switch 250 is closed and the second switch 252 is open, the impedance adjustment circuit 226 can tune the impedance to the third point 608. Finally, when the first switch 250 is closed and the second switch 252 is closed, the impedance adjustment circuit 226 can tune the impedance to the fourth point 610. As shown in FIG. 11, the first to fourth tuned impedance points 604-610 may form a circle or otherwise surround a nominal tuned impedance point 612 at 21Ω. However, this is merely an example and the nominal point 612 of the power amplifier 214 may be selected based on the particular implementation of the RF system 200. The values of the inductances and capacitances of the LC components 242-248 can be selected such that the first to forth tuned impedance points 604-610 surround the nominal point 612 of the power amplifier 214.

The following table summarizes the tuned impedance values, effective inductance, and effective capacitance provided by the impedance adjustment circuit 226 for each of the four states of the impedance adjustment circuit 226.

TABLE 1

| Impedance Point | Z - effective impedance (Ω) | L - effective inductance (pH) | C - effective capacitance (fF) |
| --- | --- | --- | --- |
| First point 604 | 18.0 + j7.8 | 940 | 400 |
| Second point 606 | 27.6 + j6.1 | 940 | 150 |
| Third point 608 | 27.6 − j7.8 | 540 | 150 |
| Fourth point | 18.0 − j6.1 | 540 | 400 |

The RF system 200 can be configured to tune the impedance of the impedance adjustment circuit 226 to minimize the EVM of the RF system 200. For example, the RF system may switch between each state of the impedance adjustment circuit 226 and determine the EVM for each state. The RF system 200 can then select the state of the impedance adjustment circuit 226 having the lowest EVM by programming the states of the two switches 250 and 252. This can be accomplished by a processor of the RF system 200 (not illustrated) using MIPI as described above.

Thus, aspects of this disclosure relate to a method of using a programmable impedance adjustment circuit 226 to select an adjusted impedance having the lowest signal EVM caused by power amplifier, such as a WiFi transmit amplifier or any similar amplifier transmitting a data-modulated signal. The method of tuning can cover a 2-dimensional area on the Smith Chart, by using only one matching circuit topology for the impedance adjustment circuit 226 (thus saving many components compared to a more generic impedance tuning circuit). This can be accomplished by matching in substantially the same direction as illustrated and discussed in connection with FIG. 7. In order to use an impedance adjustment circuit 226 that matches in only one direction, the power amplifier 212 can be slightly mismatched (e.g., biased) to create an offset starting place 402 and then matching back to the nominal tuned impedance point 406.

APPLICATIONS

Some of the embodiments described above have provided examples in connection with a WiFi capable device. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of adjusting an impedance of a power amplifier of a radio frequency system for matching with a switch die, the method comprising:
   connecting the power amplifier to the switch die via an impedance adjustment circuit, the impedance adjustment circuit including an input node configured to receive a radio frequency signal from the power amplifier, an output node configured to provide the radio frequency signal to the switch die, a plurality of electrical components arranged between the input node and the output node, and at least one switch configured to selectively electrically connect at least one of the electrical components to the input node and the output node;
   determining a level of distortion of the radio frequency system for each of a plurality of states of the at least one switch; and
   controlling the at least one switch to enter the state of the plurality of states that minimizes the level of distortion of the radio frequency system.

2. The method of claim 1 wherein the plurality of states of the at least one switch include four states that respectively define four tuned impedance points when viewed on a Smith chart, and the at least four tuned impedance points surround a target tuned impedance point of the radio frequency system.

3. The method of claim 1 wherein the plurality of electrical components include at least one series element and at least one shunt element.

4. The method of claim 3 wherein the at least one series element includes a first inductor and a second inductor and the at least one shunt element includes a first capacitor and a second capacitor.

5. The method of claim 4 wherein the impedance adjustment circuit further includes a trace that includes a first branch and a second branch, the trace is formed on multi-chip-module, and the first branch is formed to provide the first inductor and the second branch is formed to provide the second inductor.

6. The method of claim 4 wherein the first capacitor and the second capacitor are formed as metal insulator metal capacitors on the switch die.

7. The method of claim 4 wherein the first inductor is electrically connected between the input and output nodes and the at least one switch includes a first switch configured to selectively connect the second inductor between the input and output nodes.

8. The method of claim 4 wherein the second capacitor is electrically connected between the output node and ground and the at least one switch includes a second switch configured to selectively connect the first capacitor between the output node and ground.

9. The method of claim 1 wherein the plurality of states include at least four tuned impedance points when viewed on a Smith chart, and the at least four tuned impedance points surround a target tuned impedance point of the power amplifier.

10. The method of claim 9 wherein the impedance adjustment circuit is included as part of a radio frequency system including the power amplifier and the switch die.

11. A method comprising:
connecting a power amplifier to a switch die via an impedance adjustment circuit, the impedance adjustment circuit including an input node configured to receive a radio frequency signal from the power amplifier, an output node configured to provide the radio frequency signal to the switch die, a plurality of electrical components arranged between the input node and the output node, and at least one switch configured to selectively electrically connect at least one of the electrical components to the input node and the output node; and adjusting an impedance of the power amplifier by selecting one of a plurality of states of the at least one switch, each state of the plurality of states corresponding to an adjustment of an impedance of the power amplifier from a natural tune point in a direction towards a target tuned impedance point when viewed on a Smith chart.

12. The method of claim 11 wherein the plurality of states of the at least one switch include four states that respectively define four tuned impedance points when viewed on the Smith chart, and the at least four tuned impedance points surround a target tuned impedance point of a radio frequency system.

13. The method of claim 11 wherein the plurality of electrical components include at least one series element and at least one shunt element.

14. The method of claim 13 wherein the at least one series element includes a first inductor and a second inductor and the at least one shunt element includes a first capacitor and a second capacitor.

15. The method of claim 14 wherein the impedance adjustment circuit further includes a trace that includes a first branch and a second branch, the trace is formed on multi-chip-module, and the first branch is formed to provide the first inductor and the second branch is formed to provide the second inductor.

16. The method of claim 14 wherein the first capacitor and the second capacitor are formed as metal insulator metal capacitors on the switch die.

17. The method of claim 14 wherein the first inductor is electrically connected between the input and output nodes and the at least one switch includes a first switch configured to selectively connect the second inductor between the input and output nodes.

18. The method of claim 14 wherein the second capacitor is electrically connected between the output node and ground and the at least one switch includes a second switch configured to selectively connect the first capacitor between the output node and ground.

19. The method of claim 11 wherein the plurality of states include at least four tuned impedance points when viewed on the Smith chart, and the at least four tuned impedance points surround a target tuned impedance point of the power amplifier.

20. The method of claim 19 wherein the impedance adjustment circuit is included as part of a radio frequency system including the power amplifier and the switch die.

* * * * *